United States Patent [19]
Lin et al.

[11] Patent Number: 5,600,815
[45] Date of Patent: Feb. 4, 1997

[54] HIGH DENSITY BUFFER MEMORY ARCHITECTURE

[75] Inventors: Chong M. Lin, Sunnyvale; Raymond J. Werner, San Jose, both of Calif.

[73] Assignee: Seiko Epson Corporation, Tokyo, Japan

[21] Appl. No.: 469,928

[22] Filed: Jun. 6, 1995

Related U.S. Application Data

[63] Continuation of Ser. No. 357,166, Dec. 13, 1994, which is a continuation of Ser. No. 867,637, Apr. 13, 1992, abandoned.

[51] Int. Cl.$^6$ .............................. G06F 13/16; G06F 13/12
[52] U.S. Cl. ..................... 395/436; 395/250; 395/872; 395/431; 395/437; 365/78; 365/189.12; 364/DIG. 1; 364/238.7; 364/239.2; 364/249
[58] Field of Search .................... 395/250, 436, 395/437, 872, 431; 365/78, 189.12, 220; 377/64, 67

[56] References Cited

U.S. PATENT DOCUMENTS

| | | | |
|---|---|---|---|
| 3,491,341 | 1/1970 | Alaimo | 395/250 |
| 3,736,568 | 5/1973 | Snook | 395/275 |
| 3,859,640 | 1/1975 | Eberlein et al. | 365/222 |
| 3,968,478 | 7/1976 | Mensch, Jr. | 395/275 |
| 4,084,154 | 4/1978 | Panigrahi | 395/436 |
| 4,393,464 | 7/1983 | Knapp et al. | 395/800 |
| 4,513,392 | 4/1985 | Shenk | 395/437 |

FOREIGN PATENT DOCUMENTS

| | | |
|---|---|---|
| 0031499 | 7/1981 | European Pat. Off. . |
| 0365116 | 4/1990 | European Pat. Off. . |

OTHER PUBLICATIONS

Yeung et al., "A 300 MHz Bipolar–CMOS Video Shift Register with FIFO", *IEEE International Solid State Circuits Conference*, pp. 56, 57 and 388.

Walker, Steve, "Serial Interface Buffers Parallel Data", *EDN Electrical Design News*, vol. 32, No. 12, pp. 208 and 210, Jun. 11, 1987.

Rosenberg, Jerry and John Wiley & Sons, *Dictionary of Computers, Information Processing and Telecommunications*, pp. 565–567, 1987.

Mano, Morris M., *Computer Engineering: Hardware Design*, Prentice Hall, pp. 72–73 and 156–158, 1988.

*Microsoft Press: Computer Dictionary*, Microsoft Press, pp. 354–355, 1994.

*Primary Examiner*—Glenn Gossage
*Assistant Examiner*—Reginald G. Bragdon
*Attorney, Agent, or Firm*— Sterne, Kessler, Goldstein & Fox P.L.L.C.

[57] ABSTRACT

A buffer memory architecture, method, and chip floor plan allows for significant reduction in the physical area required for a buffer memory of any given size in a microelectronic device. Buffer applications wherein random access to the buffered data is not required use a CMOS dynamic serial memory with p-channel devices supplied with a voltage less positive than the voltage supplied to their respective n-wells. In a particular embodiment, three memory stages are used in a cascaded fashion. The first and third memory stages store data on a parallel basis, while the second memory stage stores data on a serial basis. The second memory stage can be fabricated using much less chip area per bit than the first and third memory stages. Significant area reduction is achieved because the second memory stage eliminates addressing overhead associated with conventional high-density memory schemes, and low voltage power supplies permit relaxation of latch-up prevention layout rules.

5 Claims, 11 Drawing Sheets

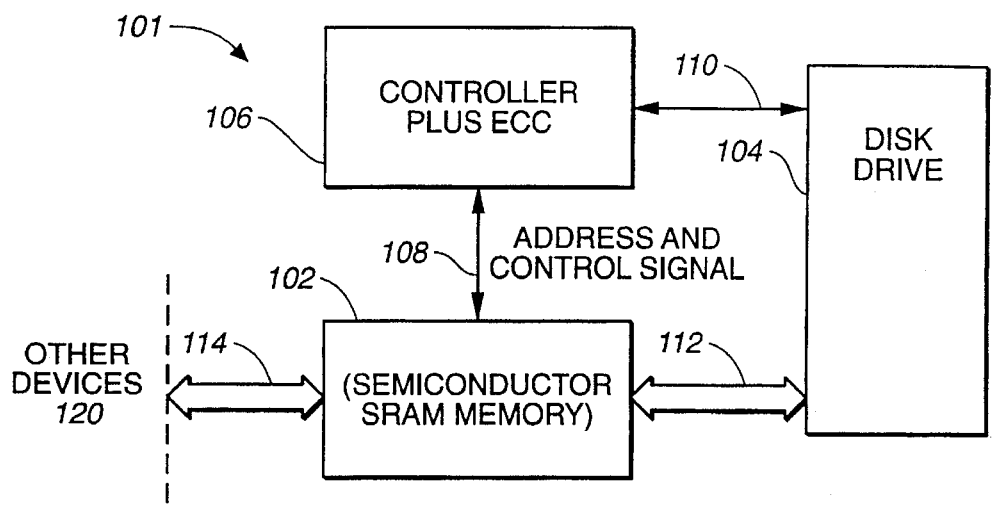
FIG._1
(PRIOR ART)
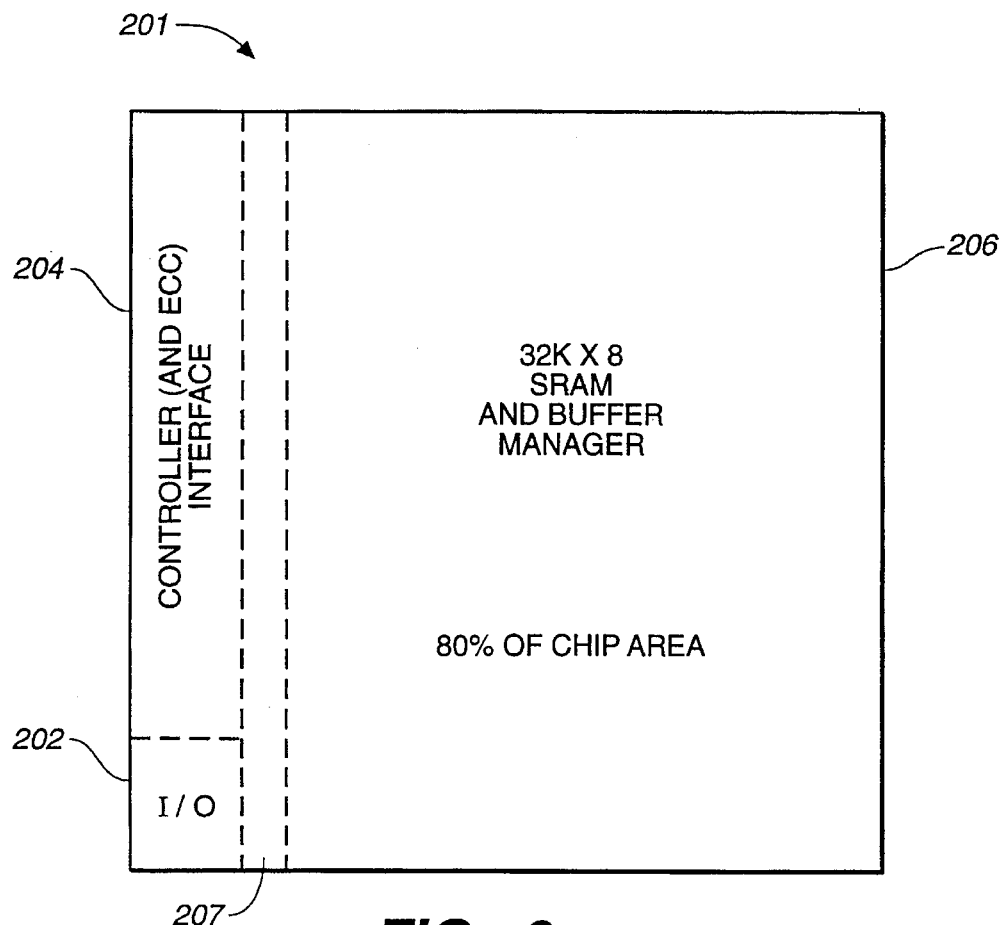
FIG._2
(PRIOR ART)

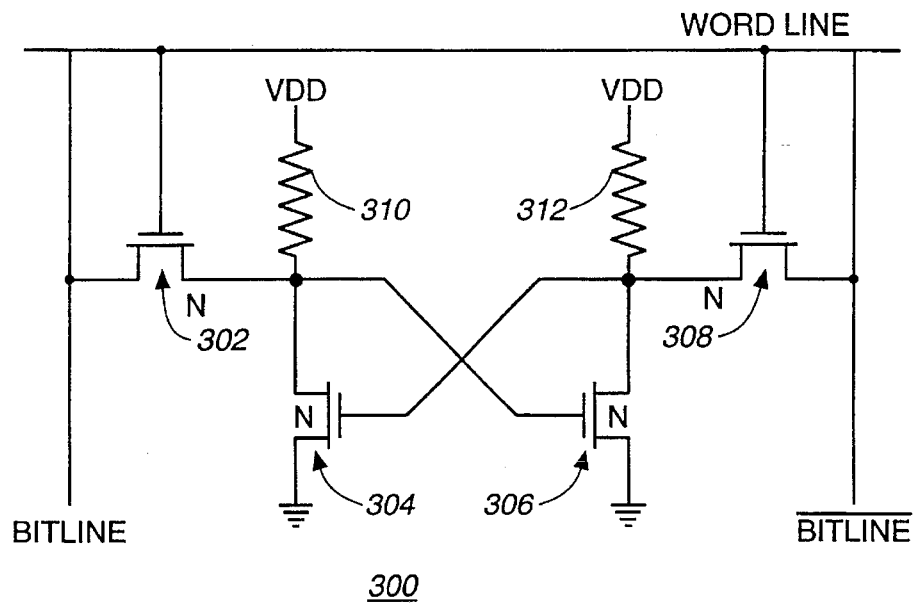
FIG._3A
(PRIOR ART)
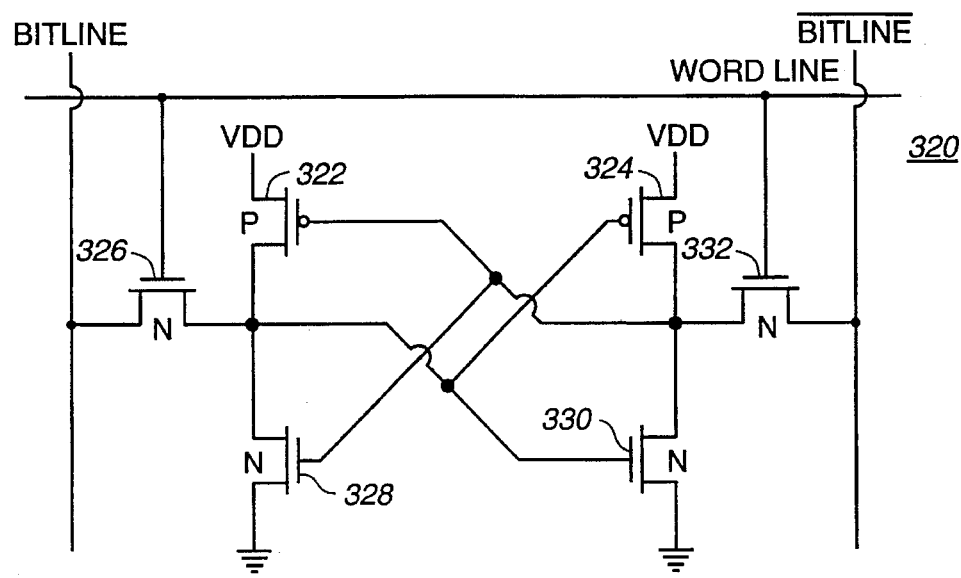
FIG._3B
(PRIOR ART)

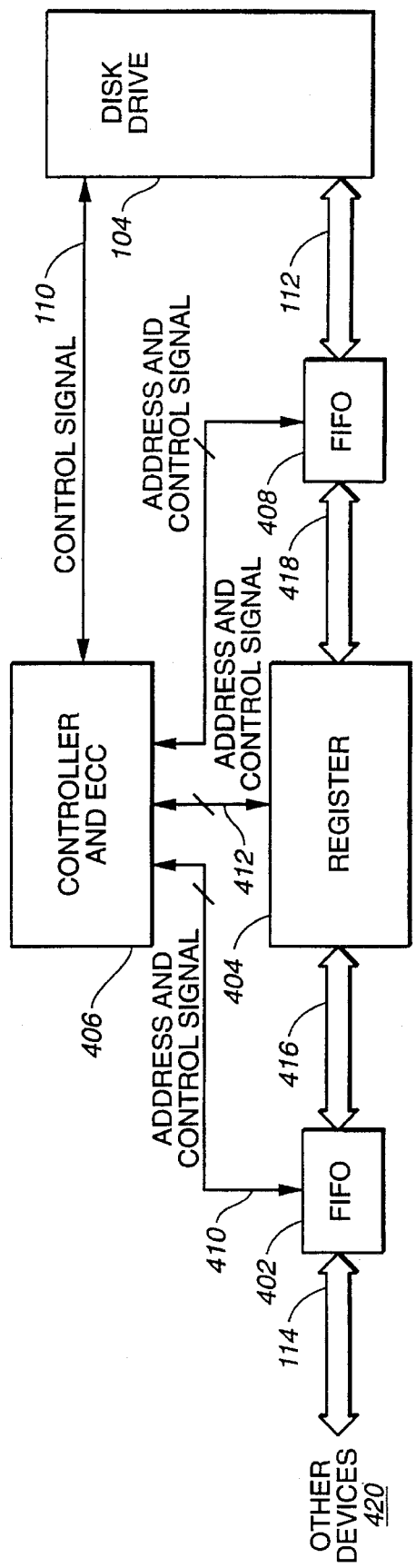
FIG._4

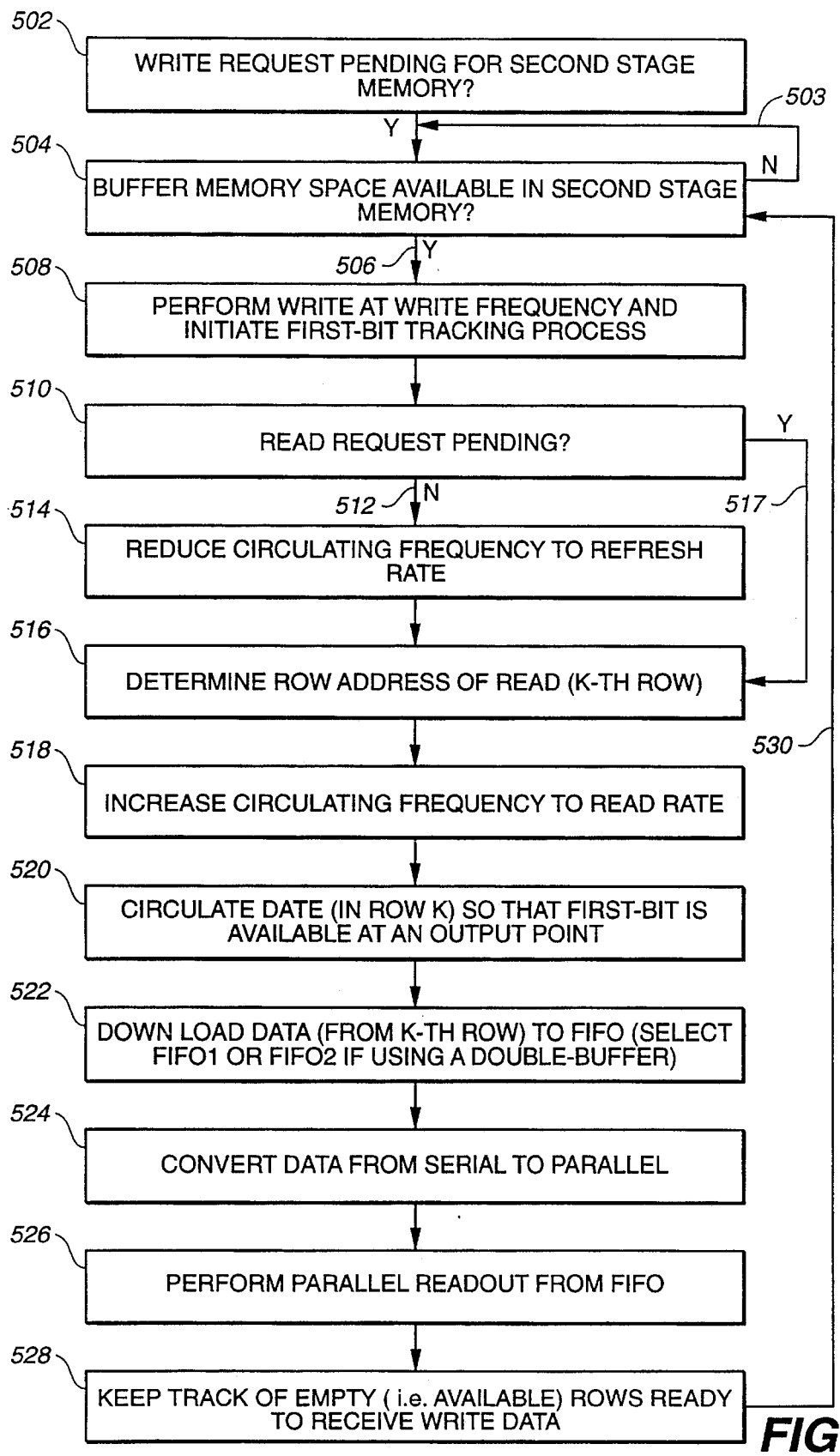
FIG._5

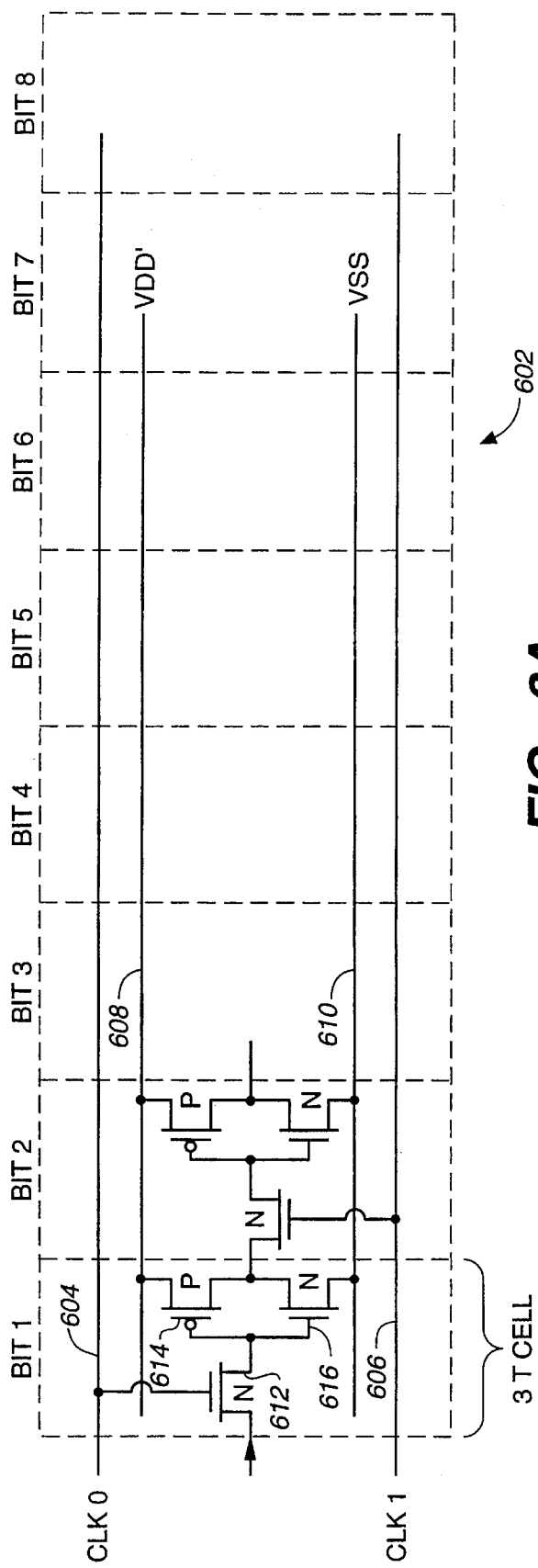
FIG._6A
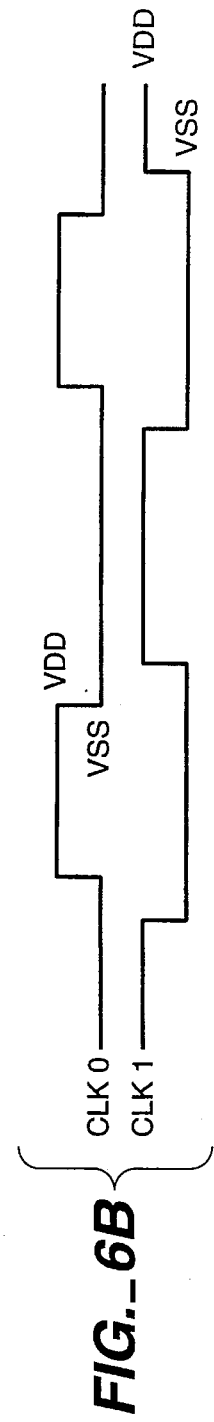
FIG._6B

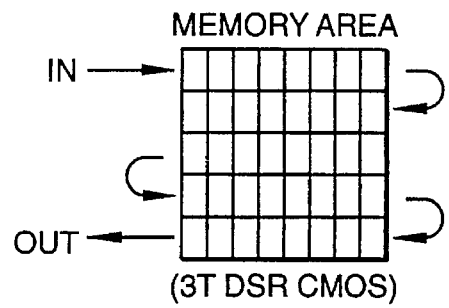
FIG._6C
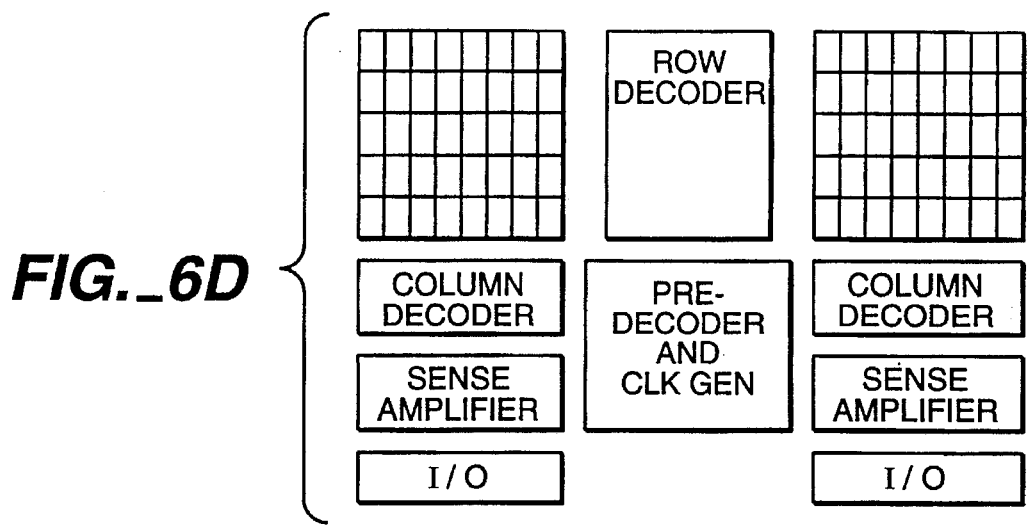
FIG._6D
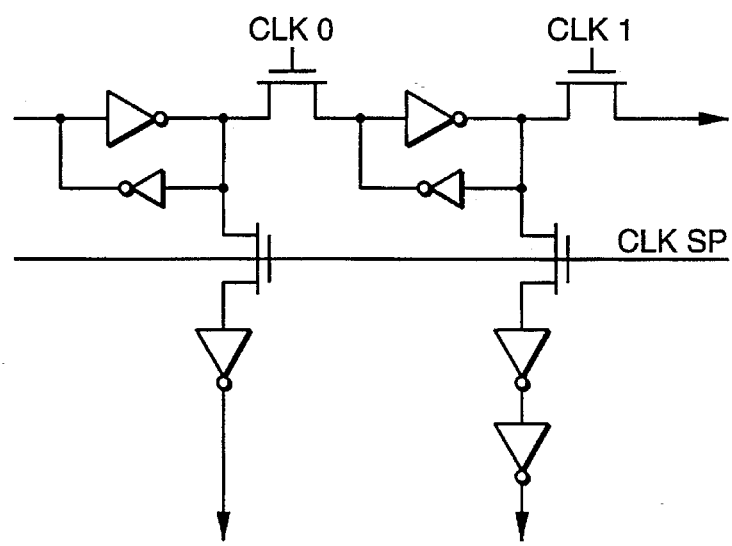
FIG._8D

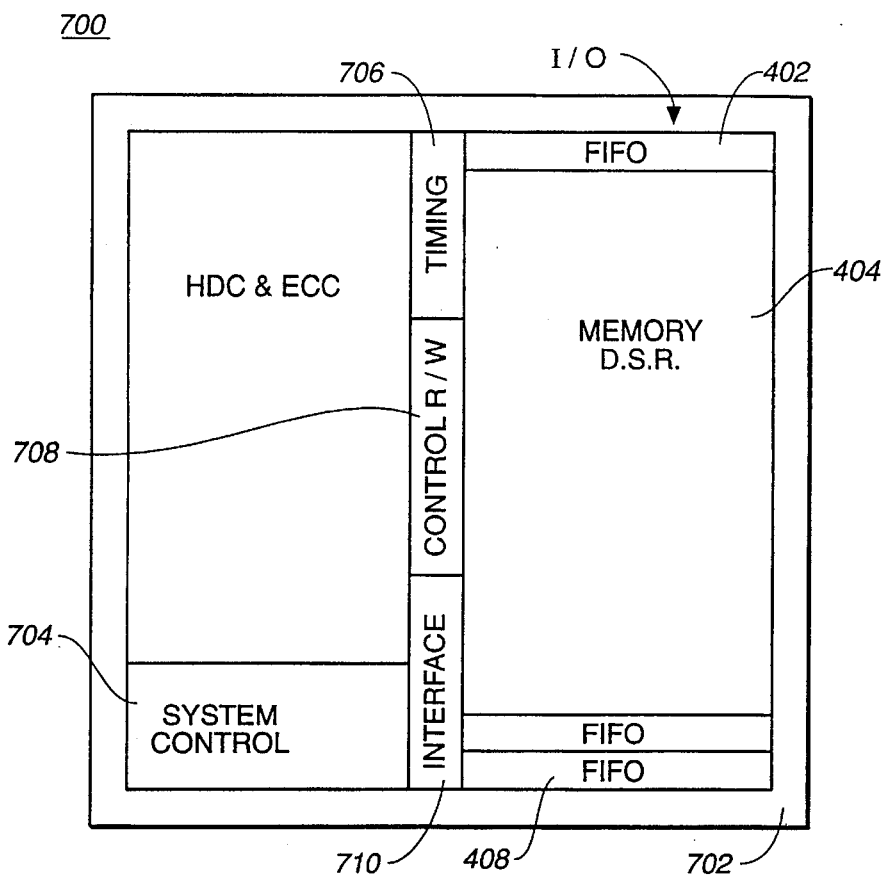
FIG._7A
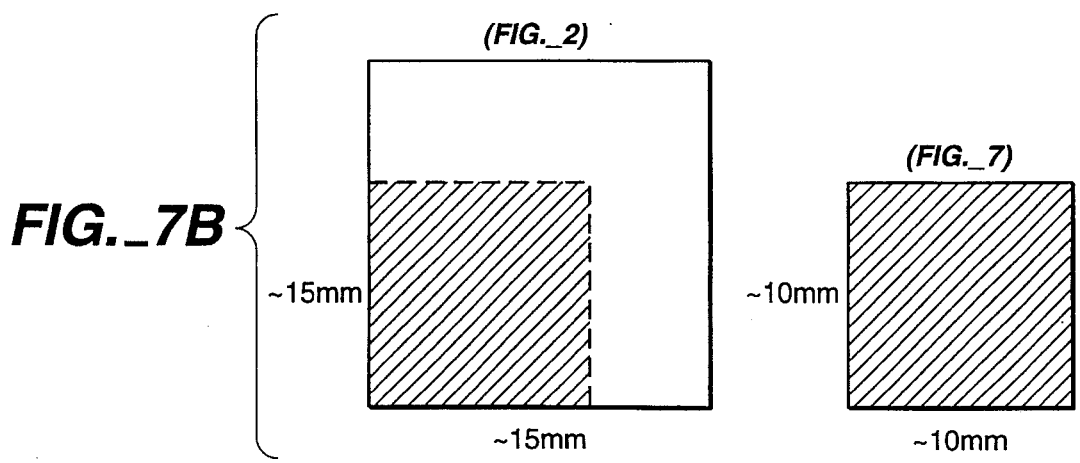
FIG._7B

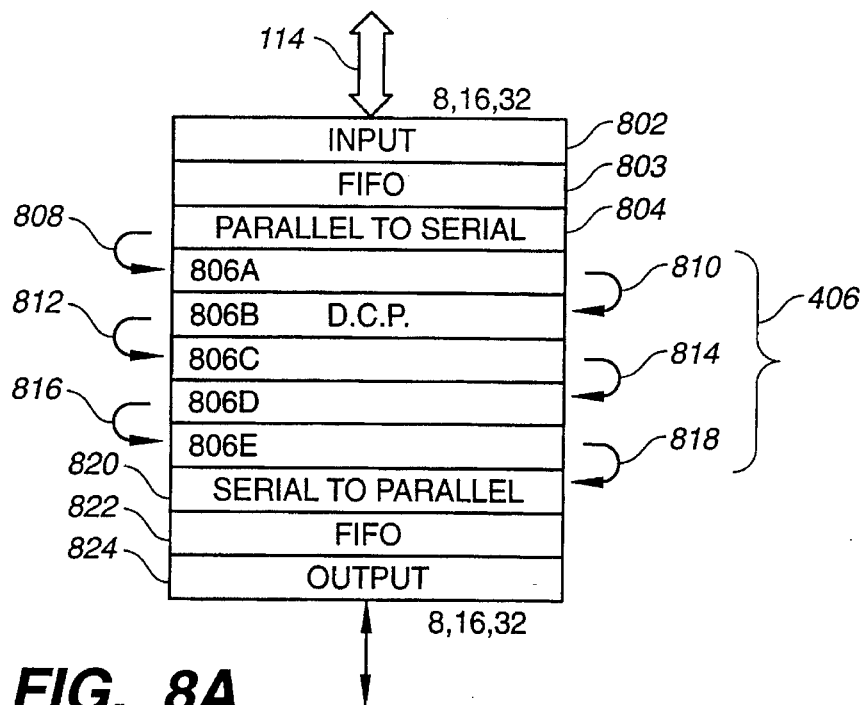
FIG._8A
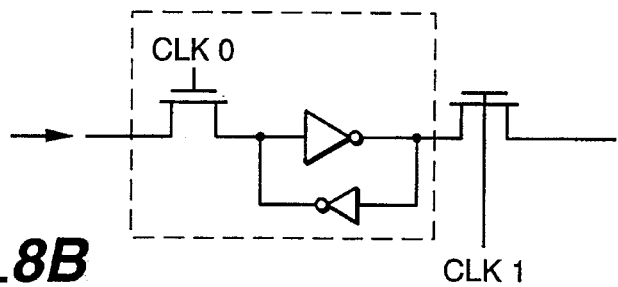
FIG._8B
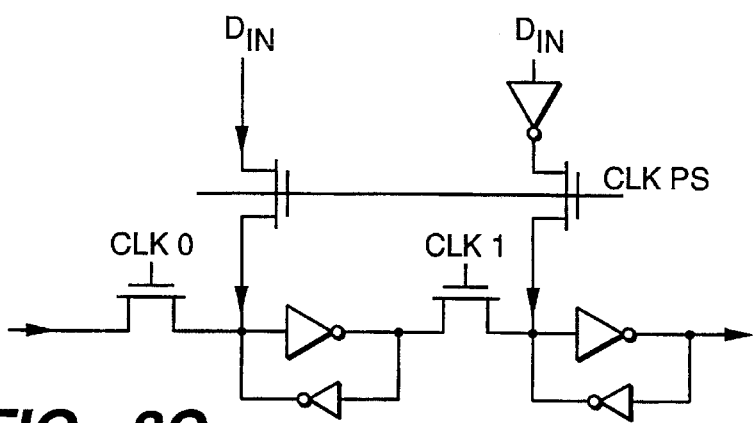
FIG._8C

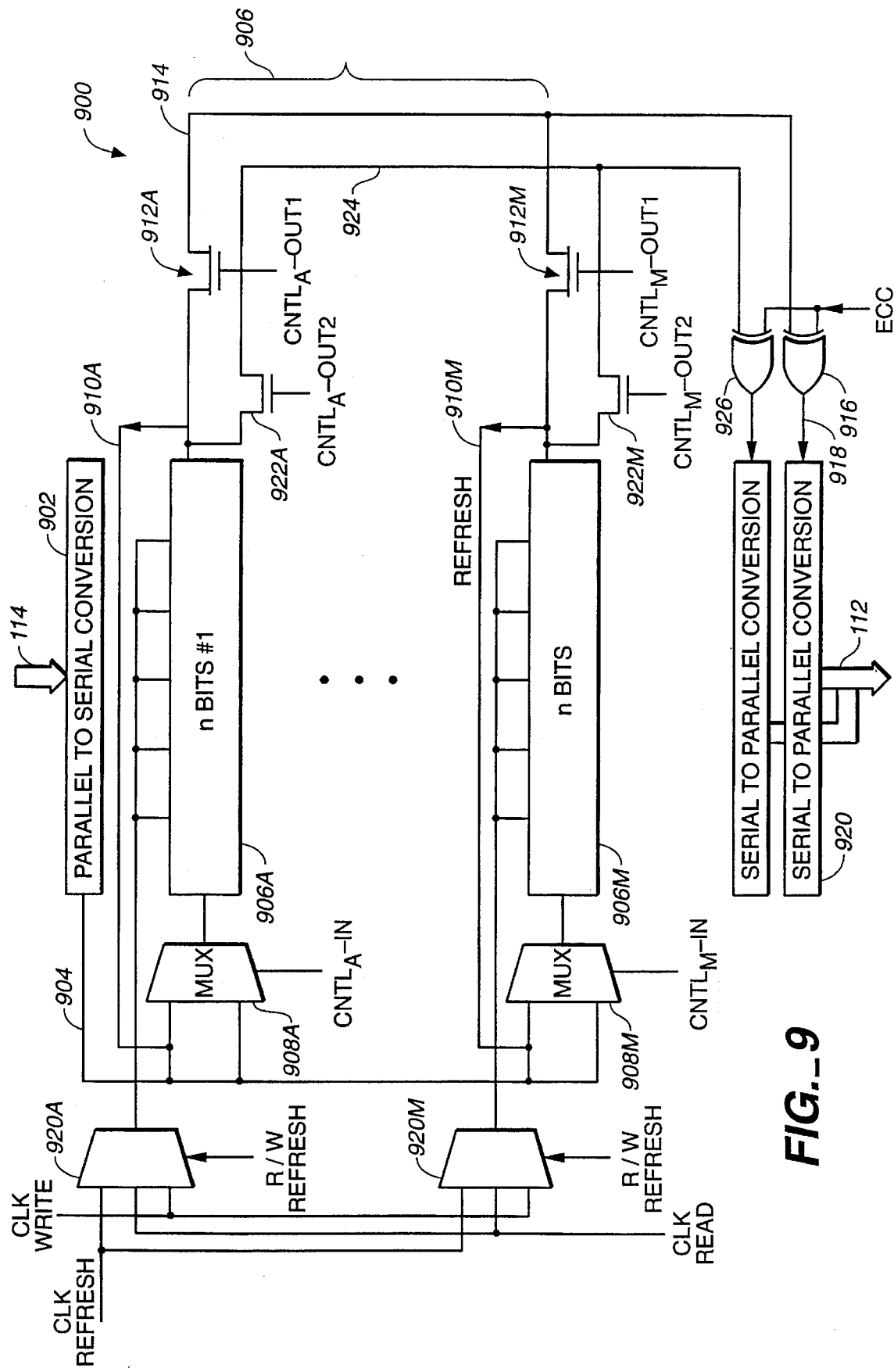
FIG._9

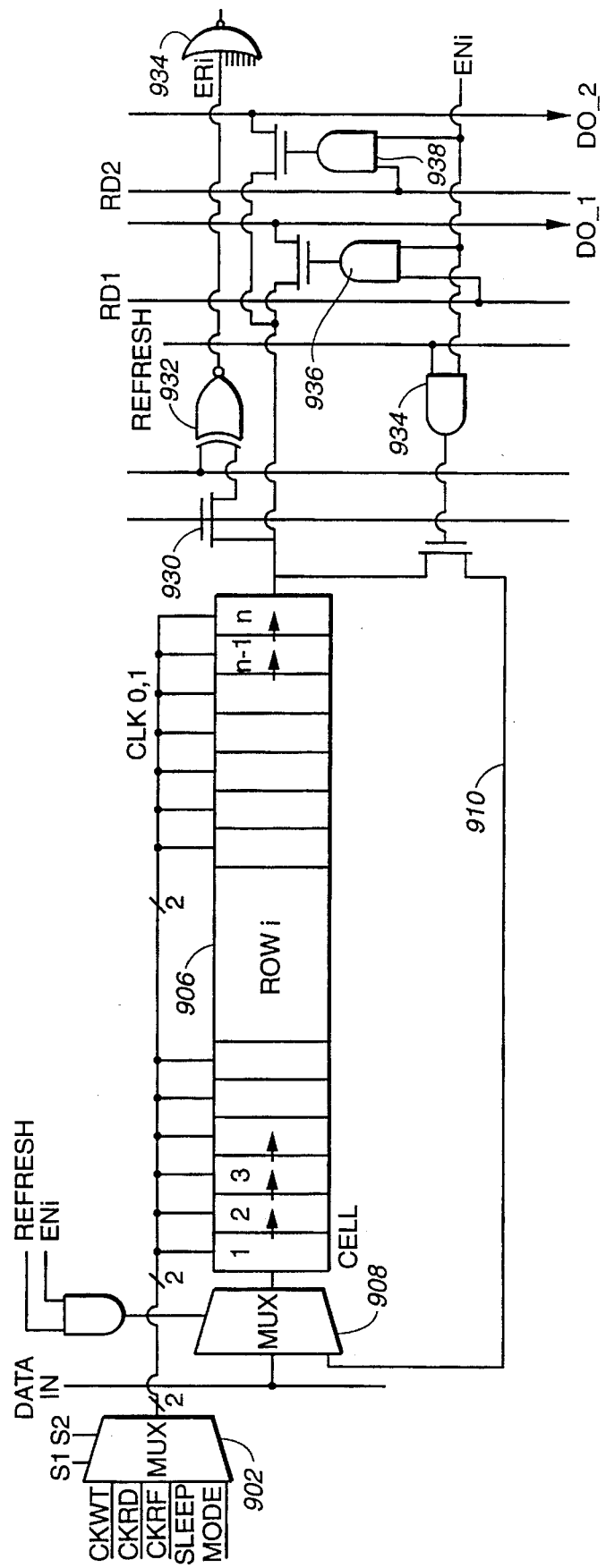
FIG._10

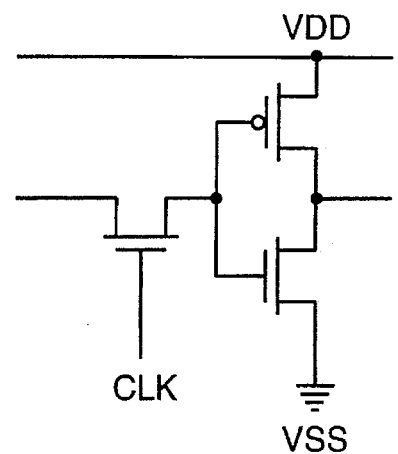
FIG._11A
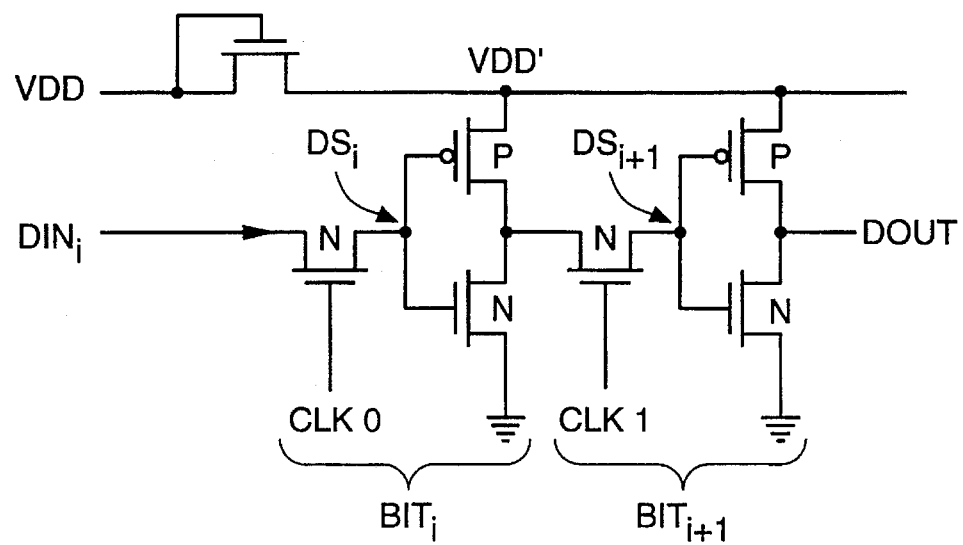
FIG._11B

HIGH DENSITY BUFFER MEMORY ARCHITECTURE

This application is a continuation of application Ser. No. 08/357,166, filed Dec. 13, 1994, which is a file wrapper continuation of application Ser. No. 07/867,637, filed Apr. 13, 1992, which is now abandoned.

BACKGROUND OF THE INVENTION

1. Field of the Invention

The present invention relates generally to systems and methods for employing electronic memory cost effectively in area, process, power and testing, in a microelectronic device. More particularly, the present invention relates to systems and methods for reducing the physical size of a memory used for handling serial data.

2. Related Art

The ENIAC (one of the first electronic computers) filled the size of one room and consumed an enormous amount of power. Today, a computer with similar or better specifications is able to fit in the palm of a human hand, and operate at a very, very low level of power.

The invention of semiconductor devices, particularly integrated circuits, has allowed engineers and scientists to reduce the size and cost of computer devices while increasing their capabilities and reliability.

Storage of data is one of the key requirements of any computer system. The processor of the computer needs to be able to access very quickly and efficiently specific data in a large set of data. For reasons of cost, the large set of data is typically stored hierarchically in a slow speed storage device such as a disk drive. The processor indicates to the disk drive the data it needs through the memory hierarchy.

The disk drive is controlled by a controller which retrieves data from, and stores data to, the disk drive. This data is transferred between the processor and the disk drive via a bus.

The cost and speed of data retrieval and storage are system parameters which have a significant impact on system performance and therefore the computer industry is constantly seeking to improve these parameters. Such is the case with the present invention.

An architectural development to increase speed in disk drives is a data buffer positioned between the slow speed disk drive and the much faster processor. Data is buffered and organized to reduce transfer time to the processor. The present invention contemplates presently known and future developed buffering operations.

FIG. 1 illustrates at an architectural, block, high level a disk controller designated generally by a reference number 101. Disk controller 101 stores and retrieves data upon command. Note that error correction coding (ECC) is sometimes used. Disk controller 101 includes a buffer memory 102 (which is typically a static random access memory (SRAM)), a disk drive 104 (or similar input/output storage device, not shown), and a controller 106. Buffer SRAM 102 acts in a conventional manner as a data storage means linking disk drive 104 with the rest of a computer system 120. Computer system 120 can be of any type from a super computer to a computer on a chip to a distributed architecture system. Computer system 120 is not shown, but it labeled: other devices. Controller 106 controls data transfer via commands received from the other devices for retrieving data from, and sending data to, buffer SRAM 102 via address and control signals on lines 108 and 110.

FIG. 2 shows a high level floor plan representation of a typical implementation in a Complementary Metal Oxide Semiconductor (CMOS) chip 201 of a portion of disk controller 101. Disk controller chip 201 has an input/output (I/O) portion 202, a controller portion 204 (which may include ECC), a timing and interface and logic portion 207, and an SRAM portion 206.

As is apparent from the floor plan of FIG. 2, a very significant portion of the real estate of chip 201 is devoted to buffer SRAM 206. Typically today, buffer SRAM 206 accounts for approximately 50% to 80% of the total are (real estate) allocated on chip 201. As a result, disk controller chip 201 having a buffer SRAM 206 of any significant storage capability requires a large die using presently available CMOS feature sizes and fabrication processes (i.e., single poly, double metal). For example, disk controller chip 201 with 32K byte (256K bits) of memory is limited to a smallest possible die size of approximately 15 mm×15 mm (600 mil$^2$) using 0.8 micron minimum feature size CMOS technology and using a conventional six transistor cell for each bit of buffer SRAM 206.

As is well known, SRAM in CMOS requires a significant number of active devices along with associated overhead devoted to addressing and control. This type of SRAM cell (for storing a single bit of data) needs these active devices and overhead in order to provide random access (read and write) to buffer SRAM 206.

FIGS. 3A and 3B show conventional SRAM cells for storing each bit of data in buffer SRAM 206.

FIG. 3A is a conventional four transistor SRAM cell 300, which is widely used. SRAM cell 300 includes four N-channel devices 302, 304, 306, and 308, and two poly load resistors 310 and 312. It should be noted that the expression "poly load resistor" is a well recognized expression in this field and refers to load resistors formed of high resistivity polycrystalline silicon. Poly load resistors require many additional process steps over a conventional CMOS process. Even using advanced fabrication technology, which is more expensive, a large amount of real estate is required for an SRAM array made up of SRAM cells 300.

FIG. 3B is a conventional six transistor SRAM cell 320. SRAM cell 320 includes two p-channel devices 322 and 324, and four n-channel devices 326, 328, 330 and 332. Each SRAM cell 320 using conventional fabrication technology takes up even more area than the four transistor SRAM cell of FIG. 3A.

What is needed is a buffer memory and a method of buffering data that utilizes conventional CMOS process technology and is capable of being reduced in layout area by a significant amount. In other words, what is needed is a buffer means that is able to utilize conventional CMOS circuit techniques, but which requires less area for the buffer memory function.

SUMMARY OF THE INVENTION

The present invention is a system, memory, layout and fabrication architecture that includes an unpartitioned or partitioned buffer made up of a plurality of dynamic shift register (DSR) cells configured for buffering a data stream (either in serial or in parallel format). The dynamic shift register (DSR) cells of the present invention are coupled together to store data in a serial fashion. The present invention is disclosed in conjunction with a disk drive controller embodiment, but can be applied to any system where the need for high-speed random access to the entire memory storage block can be eliminated. In other words, the area savings of a serial memory can be utilized whenever the system will not require equal access time to every bit of stored information. Other representative examples include, but are not limited to, bit-serial environments such as displays (including liquid crystal), optical storage devices, tape storage devices (including digital audio tape), communication systems (local area networks), and the like.

In the unpartitioned embodiment, the data is stored serially in one continuous DSR, the length of which is equal to the total storage capacity of the buffer. In the partitioned embodiment, a plurality of of DSRs are used to store data. These DSRs are each capable of serially storing a predetermined subset of the data to be buffered. The partitioned embodiment typically has separate data input and data output buses. The partitioned embodiment may be used in conjunction with an input FIFO, an output FIFO, or both. Typically these FIFOs are organized for parallel data access, and interface to the DSRs by means of parallel-to-serial and serial-to-parallel converters.

The DSR cells are typically the three-transistor type, comprising an n-channel pass device and a CMOS inverter. In another embodiment the source of the p-channel transistor is supplied with a voltage less positive than the well in which the p-channel transistor is formed. This reduces power consumption according to the well-known relationship between capacitance, voltage, and switching frequency. The reduced power embodiment according to the present invention also enables the use of mask layout dimensions which produce a smaller layout (i.e. less chip area) than conventional DSR circuits.

The present invention can be readily fabricated in a microelectronic device. The amount of area allocated to the DSRs is reduced compared to conventional SRAM. The present invention has better reliability than DRAM, uses little power, reduces testing costs, and achieves fast read/write speed even when the read frequency (f_read) is not equal to the write frequency (f_write).

Other objects, advantages and attainments together with a fuller understanding of the invention will become apparent and appreciated by referring to the following description and claims taken in conjunction with the accompanying drawings.

BRIEF DESCRIPTION OF THE DRAWINGS

In the drawings, like reference numerals indicate identical or functionally similar elements. Additionally, the left-most digit of a reference number identifies the drawing in which the reference numeral first appears.

FIG. 1 is an architectural, block, high level diagram of a conventional system incorporating a buffer memory.

FIG. 2 is a high level floor plan representation of a typical implementation on a CMOS chip of a portion of the disk memory device/system 101.

FIG. 3A shows a typical four transistor, two resistor SRAM cell.

FIG. 3B shows a typical six transistor SRAM cell.

FIG. 4 is an architectural, block, high level diagram of a disk controller memory device or system 401 according to a first embodiment of the present invention.

FIG. 5 is a flow chart of the operation of the embodiment of FIG. 4.

FIG. 6A shows an example eight-bit register (DSR) for storing eight bits of data in serial fashion.

FIG. 6B is a timing diagram show clocks CLK 1 and CLK 0 of FIG. 6A.

FIG. 6C shows a three transistor DSR (unpartitioned) circuit.

FIG. 6D shows the floorplan architecture of a conventional RAM.

FIG. 7A is a floor plan of a representative disk controller chip fabricated in a singly poly, double metal CMOS process.

FIG. 7B provides an area comparison diagram for a conventional buffer memory and a buffer memory according to the present invention.

FIG. 8A shows in an architectural block format the unpartitioned embodiment of the present invention.

FIG. 8B is a circuit diagram of a suitable five transistor static shift register cell where the small inverter symbol indicates a relatively weak inverter used for sustaining charge.

FIG. 8C is a circuit diagram of a suitable parallel to serial stage.

FIG. 8D is a circuit diagram of a suitable serial to parallel stage.

FIG. 9 is a block diagram of the partitioned embodiment of the present invention.

FIG. 10 is a high level logic schematic of a row (block) as used in the partitioned embodiment of the present invention.

FIG. 11A is a transistor level circuit schematic showing one dynamic shift register cell configured for full rail-to-rail voltage swings.

FIG. 11B is a transistor level circuit schematic showing two dynamic shift register cells configured for reduced voltage swings.

DETAILED DESCRIPTION OF THE INVENTION

Technical Terminology

The expression, rail-to-rail, is generally understood to mean switching the voltage magnitude of a signal from the most positive to the most negative power supply voltage available in the device, or vice versa. This is the meaning given to this expression throughout the instant description of the invention.

The terms chip, integrated circuit, monolithic device, semiconductor device and microelectronic device, are often used interchangeably in this field. The present invention is applicable to all of the above as they are generally understood in the field.

The terms metal line, trace, wire, conductor, signal path and signalling medium are all related. The related terms listed above, are generally interchangeable, and appear in order from most specific to most general. In this field, metal lines are sometimes referred to as traces, wires, lines, interconnect or simply metal. Metal lines, generally to aluminium (Al) or an alloy of Al and copper (Cu), are conductors which provide signal paths for coupling, or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenium (Mo), or refractory metal silicides are examples of other conductors. Signalling medium is the most general term and encompasses the others.

The term power bus(es) as used in this application refers collectively to metal lines which connect circuitry, substrate or wells to voltage supplies such as $V_{dd}$, $V_{cc}$, $V_{ss}$, ground or any other voltage supply used by the chip.

The terms pass gate, pass device, pass transistor, transfer gate, transfer device and transmission gate are used interchangeably for the purposes of this disclosure, and are used to describe a transistor circuit which electrically couples/decouples a first node to/from a second node under control of signal applied to at least one MOSFET gate electrode.

B. Serial Buffer Memory Architecture

The present invention is a buffer memory architecture and buffering method, for reducing the physical area of a memory buffer on a microelectronic device. The memory buffer comprises dynamic shift registers (DSRs) which exhibit better reliability than DRAM, produce faster read/write speed even when $f_{read} \neq f_{write}$, use little power, and reduce testing costs. This fast read/write speed can be achieved simultaneously in the buffer memory architecture of the present invention.

C. Disk Drive Controller Embodiment

FIG. 4 illustrates at an architectural, block, high level a disk memory device or system 401 of the present invention. As shown, data to and from the other devices 420 (not shown) are provided by bus 114 to a first memory stage 402. First memory stage 402 is addressable so that data stored at a particular location can be read out or written to. Typically, first memory stage 402 is an SRAM. In one embodiment, the SRAM can utilize a four transistor cell of the type of FIG. 3A or a six transistor cell of the type of FIG. 3B. Note that any suitable type of addressable memory cell can be used for first memory stage 402. First memory stage 402 typically functions as a FIFO in the illustrated architecture.

A controller 406 controls the operation of disk drive 104. Specifically, controller 406 via signal lines 410 supplies address and control signals to first memory stage 402 so as to provide desired addressing and control. This is in accordance with standard procedures for such paths.

First memory stage 402 can receive data on or send data out on bus 114 either on a parallel or serial basis. The data can be continuous or in burst mode. Any suitable data rate can be used. The data can be encoded, if desired. If the data is in parallel format, any suitable bus size can be used, including, but not limited to, 8, 16, or 32 bits.

First memory stage 402 receives the data from bus 114 and stores it so as to provide the desired buffering. Similarly, when data is received on a bus 416 (as discussed below), it is stored by first memory stage 402 before being provided to bus 114.

In one version, first memory stage 402 is a first in, first out (FIFO) buffer. This version is fast and cost effective because little, if any, addressing overhead is needed compared to RAM. The FIFO version is suitable when the blocks of data provided to or from the second memory stage 404 (discussed below) do not need to be reordered or internally addressed.

In a second version, first memory stage 402 provides data on an individual block-by-block basis to second memory stage 404.

Furthermore, stage 402 sends data to and receives data from a second memory stage 404 via a bus 416. A typical size for bus 416 is 1 bit wide. Serial transfer is the preferred mode of operation.

Second memory stage 404 stores and provides data on a more granular basis than the individual data bit basis used by first memory stage 402. This granularity is from 2 bits up to any number of desired bits that will comprise a block of data. A typical granularity for the block of data for the present invention is 4K bits.

This granularity is provided in the form of DSR rows (or blocks). There may be one or more data rows of second memory stage 404 for storing and retrieving data present in second memory stage 404. The writing/reading of data to/from each DSR row is controlled by controller 406, which provides control signals, including row addresses, via lines 412 to second memory stage 404.

A preferred implementation for the DSR rows comprising the DSR block of second memory stage 404 is that of dynamic shift registers (DSRs). The DSRs can be clocked by controller 406 via lines 412 so that data can be transferred in and out of the serial registers which form the storage devices. The DSRs are supplied with clock lines which receive the output of a multiplexor (selector). The multiplexor couples one of a plurality of two-phase clock sources to the clock lines. The clock sources are typically a read clock, a write clock, a refresh clock and a sleep-mode clock, as shown in FIG. 10.

Data is supplied to and from a third memory stage 408 by a bus 418. Bus 418 is typically 1 bit wide. Parallel data transfer and/or a double buffer for third memory stage 408 is employed when speed is needed for continuous read out.

Third memory stage 408 operates under the control of controller 406 via signal lines 414. Controller 406 provides address and control signals, such as order of write, read, and shift, to third memory stage 408 by lines 414.

Third memory stage 408 stores and provides data on a granularity level equal to the addressing scheme employed. Typically, the addressing scheme, like that used with first memory stage 402, is one of a single bit level. In this way, third memory stage 408 can store and provide data on a bit-by-bit level.

Third memory stage 408 receives data from, and sends data to, disk drive 104 via bus 112. Any type of data transfer scheme between third memory stage 408 and disk drive 104 is contemplated by the present invention. Disk drive 104 is controlled by controller 406 using control signals provided on lines 110.

Typically, third memory stage 408 provides serial data to, and receives serial data from, disk drive 104 in blocks of data bits. The size of the data blocks are selected in accordance with the physical partitioning (sector size) of data storage on the recording surface of disk drive 104. It should be appreciated that any suitable block size is contemplated by the present invention.

As shown in FIG. 4, disk drive 104 is the destination of and/or the source of data for the presentation invention. However, disk drive 104 is only an example. Any suitable type of device for receiving and/or sending serial blocks of data can be employed with the buffer method and architecture of the present invention. Representative examples include, but are not limited to, optical disk drives (including compact disks), tape drives (such as digital audio tape), visual displays (including liquid crystal displays), data communication devices and the like.

As can be now appreciated from the architecture illustrated in FIG. 4, the present invention contemplates a memory architecture as follows. The three cascaded memory stages include a first and third which provide fine, typically one bit, data granularity, and a second memory stage disposed between the two which provides a larger (typically, a line (block) of 4K bits or greater) data granularity. The larger the size of the data granularity of the second memory stage, the less overhead circuitry in required. The larger data granularity of the second stage, as will become more apparent from the discussion below, results in very significant reduction in the area required for fabrication of the second memory stage on the microelectronic device containing the present invention.

FIG. 5 shows a high level flow chart of the operation of this disk drive controller embodiment of the present invention. Referring now to FIG. 5, in a step 502, a check is made to determine if the data is ready to be written in serially to second memory stage 404. Note that the operation described can involve writing of data to disk drive 104 or the reading of data from disk drive 104. Step 502 is performed in conjunction with either first memory stage 402 or third memory stage 408 depending on the direction of the data flow. Note that if the data in the first or third memory stage is in parallel format, conversion to serial format is needed to match the DSR block format.

In a step 504, a check is made to determine whether there is sufficient storage space available in second memory stage 404 for the data that is to be written into it. If there is insufficient storage space, the operation returns to step 504 and waits for sufficient storage space to become available. If there is sufficient storage space available, the operation proceeds on to a step 506, which indicates that space is available (denominated "yes").

In a step 508, writing of the data to second memory stage 404 occurs. As discussed in other sections of this disclosure, second memory stage 404 can be unpartitioned or partitioned. In the unpartitioned situation, step 508 does not need to determine where in second memory stage 404 the block of data needs to be written since the entire memory contents of second memory stage 404 is used to store the block. In contrast, in the partitioned situation, step 508 needs to determine which DSR row (e.g. #i) needs to be written to for storing the block of data. Once this determination has been made, the transfer operation takes place from first or third memory stage (depending on which one is used) to second memory stage 404.

Second memory stage 404 circulates the stored block(s) of data through the respective DSR row(s) in order to maintain the state of the data. Recirculation of the stored block(s) of data requires that there be a way to identify the beginning of the block(s) of data so that the desired data can be read out in proper order. This identification is also performed in step 508. Specifically, either tracking of the first bit of a data block (with a counter), or encoding the first bit of the block to allow for its detection, are two approaches used by the present invention to keep track of the beginning of the block. In this way, recirculation of the block of data can be performed while still allowing for subsequent read out of the block of data starting with a specific bit.

The operation of this embodiment of the present invention next proceeds to a step 510. In step 510, a check is made to determine whether any read out of a block of data from second memory stage 404 is needed.

In the event that it is determined in step 510 that a read out of a block of data is needed, the operation proceeds by a jump 517 to a step 516 discussed below. In contrast, if step 510 determines that a read out is not needed, the operation proceeds to a step 512, denominated "no" read out is needed.

The blocks of data in the DSR rows of second memory stage 404 can be shifted at various frequencies. The higher of these frequencies, are used for writing blocks of data into, or reading blocks of data out of, the DSR. A low frequency shift clock sets the frequency at which the data in a DSR is recirculated to maintain data integrity.

In a step 514, the blocks of data in each of the DSR rows where no write or read operation is taking place are recirculated at the refresh frequency. This lower frequency results in a significant reduction in power consumption by second memory stage 404 as discussed herein. Of course, the circuits which provide the clock signal also use less power at lower frequency.

When a read out of a block of data from second memory stage 404 is needed, this begins in a step 516. In step 516, a determination is made that a read out of a block #-k is needed.

In the unpartitioned embodiment of second memory stage 404, the shift frequency of the entire DSR is increased from the relatively low refresh frequency to the higher read or write frequencies when a read or write operation is selected. In the partitioned embodiment of second memory stage 404, only the shift frequency of the DSR row storing the desired block of data is increased to the higher read frequency. Similarly, only the DSR row which is to be written to, changes from the low speed refresh clock to the high speed write clock. This is indicated by a step 518.

Because stored data is recirculating in the DSR block, read out cannot be allowed to take place until the data has recirculated to the point where the first bit of the block is positioned in (cycled to) the first bit position of the DSR block (or row if partitioned). This takes place in a step 520. The detection of the first bit of data of the block can be accomplished in several ways, including tracking the data using a counter, or decoding the first bit that was encoded (such as by well-known bit-stuffing techniques used in data communication systems) in a step 508.

In step 522, the block of data from the selected DSR block (register block) is transferred to first memory stage 402 or to third memory stage 408 depending on the data flow direction. The entire block of data is read out (clocked out) continuously from the DSR block to the first or third memory stage. Alternatively data can be read (clocked) out in bursts, rather than continuously, and transferred to the destination. First and third memory stages typically comprise RAM FIFOs that allow for bit by bit addressing. In step 522, the block of data is written into a FIFO in the order that it is clocked out of second memory stage 404. If desired, the order of the data in the FIFO stacks can be reordered using additional wires at multiple output points so that the order of the data for readout can be in the correct sequence without waiting for the very first bit recirculated to the single output point.

If the data format is a parallel one on bus 114 assuming the direction of data flow is towards first memory stage 402, or if the data format is a parallel one on bus 112 assuming the direction of data flow is towards third memory stage 408, the serial data in the first or third memory stage (depending on the one used) must be converted from serial to parallel. This conversion is done in a step 524.

After the conversion (assuming one is needed), the data stored in first memory stage or third memory stage (depending on which is used) is read out onto bus 114 or 112 in normal fashion. This occurs in a step 526.

In a step 528, tracking of the read out of data from the first memory stage 402 or third memory stage 408 is done. In this way, the method of the present invention allows DSR rows which have just transferred data out to become eligible to receive data from a write-in bus.

After completion of step 528, the method of the present invention jumps as indicated by a line 530 back to step 506. In this way, the present invention can write/read data to/from disk drive 104.

The present invention contemplates the use of presently available and future developed cells allowing for individual addressing for each of the memory locations of first memory stage 402 and third memory stage 408. The four transistor cell shown in FIG. 3A and the six transistor cell shown in FIG. 3B are typical examples of cells that can be used in fabricating first memory stage 402 and third memory stage 408 in a MOS chip (or a block of a larger chip).

Second memory stage 404 contemplates any presently available or future developed cell structure which allows for the dynamic storage of two or more bits of information, that can be written to or read out serially using a simple clock scheme. In other words, no specific addressing beyond the particular line of data is needed within the structure used to fabricate second memory stage 404.

FIGS. 6A and 6B show a representative example of an eight-bit register block for dynamically storing eight bits of data in a serial fashion. As shown in FIGS. 6A and 6B, a significant reduction in the number of active devices for the given number of bits stored is achieved. Specifically, as shown in FIG. 6A, each storage cell (Bits 1 to 8) in DSR block 602 comprises a three transistor circuit. Each cell has an N-channel transistor 612, a P-channel transistor 614, and an N-channel transistor 616. There is a clock line 604 for a clock signal Clk0, and a clock line 606 for a clock signal Clk1. FIG 6B shows the timing diagram for non-overlapping clocks Clk0 and Clk1. There is a Vdd' power supply bus 608, and a Vss power supply bus 610. Vdd'=Vdd−Vtn', where Vdd is nominally 5±0.5 volts, and Vtn' is the N-channel threshold voltage with body effect. Vtn without body effect is typically 0.75±0.15 volts, although Vtn may be as low as 0.1 volts and as high 2.0 volts and still serve to provide a reduced power supply Vdd' in a nominal 5 volt system. For a scaled-down process running at 3 V or less, the transistor threshold voltages are also scaled down.

In operation, a bit of data is clocked into the cell through n-channel device 612 and is stored as a charge packet on the node formed by the gate electrode of device 614, the gate electrode of device 616, the source of device 612, and various parasitic capacitances resulting from the particular layout used. At the next clock phase, this stored information is passed to the next serially connected cell.

The are savings produced by use of the present invention can be appreciated by referring to FIGS. 6C and 6D. Assuming that the DSR block size is much larger than the size of first memory stage 402 and third memory stage 408, area savings over an equivalent amount of 4T SRAM memory on a chip can be 25% and up. If a 6T SRAM memory cell is used, savings can be more than 50%.

FIG. 7A shows a floor plan of a representative disk controller chip fabricated in CMOS for providing 32 K byte data storage capacity. FIG. 7B show a size comparison between a conventional buffer memory scheme and that of the present invention.

In the chip shown in FIG. 7, the storage capacity of the first memory stage 402 is 512 B. The storage capacity of the second memory stage 404 is 32 KB. The storage capacity of the third memory stage 408 is 512 B. The total storage capability of the three memory stages is 33 KB. These memory sizes fare for illustrative purposes only, and it should be appreciated that many memory configuration sizes are possible.

As shown in FIG. 7B, the relative space required for implementing these three memory stages is shown. It can be seen that the reduction in the overall size of the memory areas has been quite significant as compared to the floor plans shown for a comparable device in FIG. 2.

FIG. 7A shows the areas of chip 700 that are devoted to other functions. Specifically, there is an I/O block 702, a system control block 704, a hard disk control portion (with ECC) 406, a timing block 706, a read/write control block 708, and an interface block 710. The present invention is preferably used in a disk controller device. However, as stated above, it should be understood that the present invention is not so limited. As stated herein, representative examples include, but are not limited to, CD-ROM, LCD, and DAT. IN other words, the present invention is an architectural strategy that allows for a significant reduction in the size of the memory area of a given semiconductor chip. Those of ordinary skill in the art will recognize that the present invention is not limited to CMOS fabrication, but is equally applicable to any semiconductor fabrication technique capable of dynamic charge storage.

The advantage is scalable with process, power supply, and interconnection technology, and maintains its superiority, in terms of economics and reliability, against 6T SRAM, 4T SRAM, and DRAM.

In the example shown with respect to FIGS. 4–6, a single chip is used in fabricating controller 406, first memory stage 402, second memory stage 404, third memory stage 408, and associated busses, control lines and address lines.

The present invention contemplates being part of a larger chip, which will provide processing, data transfer, computational, or other functionality in addition to the functionality provided by the present invention. The present invention, since it does not use any different fabrication techniques than other logic technologies, can be readily utilized in larger logic chip layouts so as to provide the desired memory capability with the corresponding size reduction without increasing processing complexity and cost. In other words, the present invention can be utilized in larger chips to produce significant reduction in the area of those chips without the process complexity associated with high-density SRAMs and DRAMs.

D. SRAM or SFIFO and Unpartitioned DSR Embodiment

An embodiment of the present invention allows for parallel data input and output using first in, first out (FIFO) stages in conjunction with serial storage of data in the intermediate dynamic shift register (DSR) stage. The intermediate stage is unpartitioned. This embodiment produced significant reductions in fabrication layout area for a given storage capacity, since there is no overhead for the intermediate stage, which is the stage which stores a significant percentage of the data. It has particular applicability for disk controller, video and audio controller applications.

FIG. 8A shows the present invention in a architectural block format. Bus (typically bidirectional) 114 is connected to an input stage 802. Data is supplied on bus 114 in a parallel fashion, typically 8, 16 or 32 bits wide, but the present invention contemplates any parallel bus width from 2 bits or greater. If 1 bit, the parallel to serial section 804 is not needed.

Input stage 802 can be any of the well-known input interface circuits appropriate for the system environment in which the present invention is to be used. Buffered input bits from input stage 802 are supplied in parallel to the storage locations of FIFO 803. Since parallel transfer is the preferred mode in this embodiment, a much higher data transfer rate, or higher bandwidth for a given bus clock rate can be achieved in this embodiment as compared to serial transfer.

The function of FIFO 803 is to provide parallel storage of the data received from input stage 802, or the data received from a parallel-to-serial stage 804 depending on the direction data flow through the embodiment. A representative size for FIFO 803 is 512 bytes (with each byte being 8 bits), but it should be understood that the size is application dependent and any size can be used. FIFO 803 is needed to temporarily store data flow from bus 114 to serial stages 806, and the flow of data from serial stages 806 to FIFO 803. In this unpartitioned embodiment, when the serial stages 406 are full, the FIFO 803 stores input data temporarily until vacancies in the serial stages 406 occur. Note that in the partitioned embodiment discussed in a different section, FIFO 803 may not necessarily be needed.

A preferred form for FIFO 803 is a static shift register. A representative static shift register cell implementation can be a five transistor circuit as shown in FIG. 8B. However, the present invention contemplates any suitable circuit for implementing FIFO 803 on-chip. Although a 3 transistor DSR cell is sufficient for most applications, a more complex 5T static shift register will simplify the timing requirements.

The parallel output of FIFO 803 is supplied by suitable interconnections (not shown) to parallel-to-serial stage 804. The function of parallel-to-serial stage 804 is to convert the parallel bit stream from FIFO 803 to a serial bit stream for serial stages 806. It can be appreciated that the width of parallel-to-serial stage 804 is the same as the width of FIFO 803 for layout alignment.

A preferred implementation of parallel-to-serial stage 804 is shown in FIG. 8C. However, the present invention contemplates any suitable implementation of parallel-to-serial stage 804 that can be fabricated on a chip.

The bits of data in parallel-to-serial stage 804 are clocked out in parallel under control of a suitable clock means shown in FIG. 8D. For purposes of explanation only, as shown in FIG. 8A, the serial bit stream is shown as coming out of the left side of parallel-to-serial stage 804 by an arrow 808. This serial bit stream as indicated by arrow 808 is supplied to a first line 806A of serial stage 806, which clocks in the received bit stream as discussed in detail below.

Serial stage 806 stores in serial fashion the data bits that are supplied by parallel-to-serial stage 804, or by a serial-to-parallel stage 820. The preferred implementation for serial stage 806 is one using dynamic shift registers (DSRs), one DSR for each bit that is stored. As discussed herein, a very significant reduction in area due to simpler circuitry and less overhead, complexity of fabrication as compared to SRAM and reliability and process compatibility to DRAM is achieved by the present invention by the use of DSRs for the serial stage 806. The inventor acknowledges that this is counter-intuitive based on conventional thinking in the semiconductor industry because of the preoccupation about the suitability of SRAM. The inventor realized that his approach results in a reduction in overhead and improvement in read/write timing, power reduction, and testing costs.

Serial stage 806 comprises one continuous dynamic shift register whose layout may be implemented such that two or more rows (each row being 2 or more bits long) which are connected in serial may be used. Representative of this approach is the embodiment of FIG. 8A, where there are five rows of the DSR, labelled 806A through 806E, which are connected serially as indicated by arrows 808, 810, 812, 814, and 816, respectively. In other words, a long DSR may be physically segmented to comply with physical or layout constraints, however, it is logically and electrically configured such that it acts as a continuous DSR.

This embodiment of the present invention is referred to as an unpartitioned serial stage 806. This means that all of the serially stored data must pass through each stage of the DSR 806 before it is output. In other words, the serial bit stream passes through all of rows 806A through 806E or through all of rows 806E through 806A (depending on the data flow direction) before it is output.

As discussed in the section entitled Disk Drive Controller Embodiment, the bits stored in the DSR have to be sequentially clocked through DSR block 806 in order not to lose these bits through the dissipation of the charge (which signifies the state of the bit) stored in each DSR stage. The minimum clock rate at which this must occur determines the refresh rate. However, this refresh rate can be much slower than the rate at which the data is clocked into and out of serial stage 806. As indicated in step 520 (FIG. 5), the circulating data can be tracked, or a start bit can be encoded for on-site detection.

To use the recirculating information for read out, one suitable approach is to circulate the START BIT to the END and shift it out if this block can be prefetched for reading. However, if fast read out is needed, the read out point can be placed, for example, at the ¼, ½, ¾, points to shorten the waiting time by a factor of four, for example.

The serial bit stream from the output of the last row 806E of DSR block 806 is provided to the serial input of serial-to-parallel stage 820, as indicated by an arrow 818. Serial-to-parallel stage 820 performs the inverse function of parallel-to-serial stage 804. In other words, it converts the serial bit stream to a parallel output. Both stages 820 and 804 can be fabricated on the chip in the same or similar fashion.

The parallel output of serial-to-parallel stage 820 is provided by interconnections (not shown) to a FIFO 822. FIFO 822 controls the outputting of parallel data in the same fashion that FIFO 808 controls the inputting of parallel data. FIFO 822 can be implemented on the chip in the same or similar fashion as is FIFO 808. A preferred form for FIFO 808 is a static shift register (SSR) for easy timing, but the present invention contemplates the same alternatives for FIFO 822 as it does for FIFO 803.

The parallel output of FIFO 822 is supplied in parallel to an output stage 824, which acts to buffer the data in the same fashion that input stage 802 does on the input side. The output of output stage 824 is coupled to bus 112.

It should be understood that the width of output stage 424 is typically 8, 16 or 32 bits, but that the present invention contemplates any parallel bus size. It should also be understood that the present invention contemplates a different size for parallel bus 112 than for parallel bus 114.

The present invention contemplates the use of dual-ported SSR for FIFO 803 and/or for FIFO 822. The use of dual-ported SSR achieves the benefit of flexibility in reading out from the same memory for two different needs or requirements at the same time. The double buffer structure further enhances the continuous readout operation, as described herein. Any suitable type of dual-ported SSR or DSR or dual-ported SRAM compatible with the chip fabrication process can be used.

E. Partitioned DSR Embodiment

This embodiment of the present invention allows for individual lines of serial register 906 to be individually written to and read from. This architecture offers several advantages.

One advantage is access flexibility. A data block stored in a DSR row can be dealt with individually. This allows for the read and write speeds (frequencies) to be different, as discussed below. Individual access of the individual lines of data should be compared to the unpartitioned embodiment, where the data stored in serial register 906 must be dealt with on the basis of all of the data stored in serial register 906. The measure of this improvement of access if n, where n is an positive integer equal to the number of lines of the serial register that can be individually accessed. In other words, read-out speed can be faster for the partitioned case by a factor of n, where n is the number of partitioned blocks.

Another advantage of a partitioned architecture is that read and write speeds of the various blocks can be different. In order to achieve a variety of read and write speeds, the clocks to the various shift register blocks must be generated separately.

Another advantage of this embodiment is redundancy. A manufacturing or electrical defect in a line of serial register 906 can be overcome in hardware or a combination of hardware and software. In hardware this is achieved by disabling the defective line so that no serial data can be written to or read from that line. In the hardware/software combination, this can be achieved by controlling the operation of the lines of shift register 906, under software control, so that the defective line is operationally inactivated. In practice, extra lines are included in serial register 906 in an amount equal to the desired increase in redundancy. This redundancy produces an increase in the range of approximately 2 to 5 times the yield for currently available process technologies.

For larger memories, an improvement of 5 to 10 times is possible. This can be seen from the following example. A typical yield range for a CMOS device manufactured in a submicron process with a size of 10 mm×10 mm chip is approximately between 15% and 50%. If 80% of the failures come from the memory portion due to the failure of a single bit, then yield can go up to 80% with the inclusion of redundancy circuits. It should be noted that redundancy can not be conveniently implemented in the unpartitioned embodiment.

An additional advantage is power saving. In operation, the lines being written to and/or read from need to be clocked at f_read or f_write whereas, the remaining lines of shift register 906 can be run much more slowly (i.e. the minimum refresh rate). A measure of the AC power saving is proportional to the following:

$$P = C * V^2 * f \quad \text{Eq. (1)}$$

$$k = \frac{2*f + (i-2)*\frac{f}{j}}{i*f} \quad \text{Eq. (2)}$$

where C is capacitive load, V is the rail-to-rail voltage swing, k is the power reduction rate, i is the total number of rows, and j is the frequency reduction factor.

Equation (2) shows that a power reduction of approximately 100 can be achieved if j=100, i=128. In other words, in this example only two of the 128 rows are running at full speed, while 126 out of 128 rows are running with a clock 100 times slower than the full speed clock. This reduction acts to decrease power dissipation requirements for the chip and to improve battery life where a battery power source is used. Yet the data integrity is still up to 100 times better than in a typical DRAM.

A high level architectural block diagram of the partitioned DSR embodiment is shown in FIG. 9. The partitioned embodiment allows for bidirectional data flow similar to the unpartitioned embodiment. As shown, parallel bus 114 supplies parallel data (typically 8, 16, or 32 bits wide) to a parallel conversion stage 902, which converts the parallel data to a serial format.

The serial bit stream on the output of parallel-to-serial conversion stage 902 is supplied on a line 904 to the blocks of DSR that make up a serial register 906. As shown in FIG. 9, there are m lines 906A to 906M of DSR, where m is a positive integer greater than or equal to 2. Each of blocks 906A to 906M stores n bits of data, where n is a positive integer greater than or equal to 2. Each of blocks 906A to 906M is fabricated on the chip using DSRs, preferably, but not limited to, the embodiment shown in FIG. 6A.

Each of blocks 906A to 906M has an associated multiplexer 908A to 908M. Each multiplexer 908A to 908M has one input connected to line 904, and a second input connected to an associated refresh feedback line 910A to 910M. Each refresh line provides a feedback path for its associated line 906A to 906M to allow the serial stream of bits stored in lines 906A to 906M to be recirculated in the refresh mode so that the storage of the bit stream is maintained. The refresh clock rate only needs to maintain a storage node charge level which has enough signal to noise margin to be regenerated and maximized again at the end of the storage phase of the clock. Even a relatively slow 100 KHz 50% duty cycle refresh clock provides refresh every 5 microseconds, as compared to many DRAMs which are required to wait up to 4 milliseconds for refresh. Further, unlike the complex refresh scheme of a DRAM, the DSR amplifies every bit directly, each clock cycle, and without the charge sharing and redistribution encountered in DRAMs.

Each multiplexer 908A to 908M has a control input for controlling the state of the multiplexer. The control input signal, denominated $CNTL_i$-in, controls whether the multiplexer is switched to receive the serial bit stream on line 904 (the write mode), or is switched to select feedback line 908A to 908M for the refresh mode.

The output serial bit stream from each DSR row 908A to 908M is provided on an associated line to an associated pass device 912A to 912M. The output side of pass devices 912A to 912M is connected to a common output line 914. Each pass device 912A to 912M has a control input that is supplied with a control signal $CNTL_i$-out that controls whether the pass device is on or off (details of which are shown in FIG. 10). A preferred form for pass devices 912A to 912M is a full CMOS transmission gate. It should be noted that any suitable means for coupling the DSR row output onto output line 914 is contemplated. Such coupling schemes may include, but are not limited to, analog charge transfer, digital signal propagation, capacitive coupling, tri-state buffer coupling, single transistor coupling, or the like. For the double output buffer architecture as shown in FIG. 9, two coupling means (912A to 912M and 922A to 922M) are provided to the output of each DSR block.

The double buffer structure is used to enable continuous readout of data. When a first buffer is transferring data out, a second buffer can concurrently receive data from DSR storage. In this way, the controller can pre-fetch the next needed data block and transfer it into the second buffer.

While the first buffer completes its output transfer, the second buffer has been made ready to transfer out data. Continuous data transfer is then possible by switching between the outputs of the first and second FIFO buffers. Because the chip area consumed by the FIFO is only a small part of the hole on-chip buffer memory, and further because the presence of the FIFO buffer expands the total on-chip buffer memory capacity, the overhead of the double FIFO scheme is negligible.

Line 914 is connected to one input of an XOR gate 916. The second input of XOR gate 916 is connected to an error correction code signal, that causes correction of bit errors. Line 924 is connected to one input of XOR 926. The second input of XOR gate 926 is connected to an error correction code signal, that causes correction of bit errors.

The serial bit stream at the output of XOR gate 916 is provided by a line 918 to the input of a serial-to-parallel conversion stage 920. Serial-to-parallel conversion stage 920 converts the serial bit stream to a parallel bit stream having the desired bit width (8, 16 or 32 bits is typical). Serial-to-parallel conversion stage 920 is the circuit inverse of parallel-to-serial conversion stage 902, and can be fabricated in similar fashion.

The parallel bit stream from serial-to-parallel conversion stage 920 is provided to parallel bus 112. Note that the width of bus 114 can be different from the width of bus 112.

In operation, the parallel bit stream on bus 114 is converted into a serial bit stream by parallel-to-serial conversion stage 902. The serialized data is then written into one of designated DSR lines 906A to 906M under control of associated multiplexers 908A to 908M in accordance with the corresponding control signal $CNTL_i$-in. Note that the selection for writing of the DSR rows does not have to correspond to the physical order of DSR rows 906A to 906M. Any desired ordering can be used. This results in random access of rows of information.

In read mode, the blocks of serial data from DSR rows 906A to 906M are read out under control of the $CNTL_i$-out signals and the associated pass devices 912A to 912M. Again, it should be noted that the rows of data can be read out in an order different to the order they were written or in an order different than the physical layout of DSR rows 906A to 906M.

Serial data is transferred in or out of DSR rows 906A to 906M at a full write or read clock rate. These full-speed clocks (as opposed to low-speed refresh or sleep clocks) may be 50 MHz for current state of the art products, but any suitable clock rate can be used.

F. Power Reduction in DSR

The present invention includes an improved dynamic shift register cell that consumes less power than conventional DSR cells.

The three transistor (3T) DSR array of the present invention saves chip area in implementation. It also requires fewer processing steps than the 4T+2R SRAM process. Moreover, the control logic, timing, and process requirements are simpler than those for charge coupled devices (CDDs), and one transistor (1T) DRAMs.

In addition, the technology used to implement the improved dynamic shift register cell is compatible with the logic function oriented CMOS/BiCMOS fabrication technology which is used for many controller chips and the like.

Referring now to FIG. 11A, which shows a conventional cell structure for a dynamic shift register, this cell structure stores 1 bit of data. The full Vdd-to-Vss, or rail-to-rail swing is used. This causes the power dissipation to be high, particularly in terms of AC power dissipation. As described above in Eq. (1), power is proportional to the square of the magnitude of the voltage. Therefore, reducing the magnitude of the voltage swing will significantly reduce power consumption.

The voltage level at the output of N-channel pass device 612 is zero when a logic zero is transferred. However, the voltage level at the output of N-channel pass device 612 is dropped by one N-channel threshold ($V_{tn}$) as compared to the voltage at the input of N-channel pass device 612 when a logic one is transferred. This causes both devices 614 and 616 (which together form a CMOS inverter) to be partially on, thus creating a DC path from power to ground. To eliminate this DC current path, p-channel device 614 is supplied with a voltage which is also reduced by one N-channel threshold drop. In this way P-channel transistor 614 has a gate to source voltage of zero and will not turn on (because the p-channel device has a negative threshold voltage). With transistor 614 off, there is no DC current path.

Use of the reduced P-channel source voltage allows the layout of the DSR cells to be modified such that an increase in the cell density is achieved. Conventionally, to prevent latch-up in CMOS circuits, certain layout constraints are placed on chip designers. These include minimum spacings between $p^+$ and the n-well, and $n^+$ and the p-well. However, the reduced p-channel source voltage permits reduction of the conventional design rule dimensions (i.e. minimum spacings between $p^+$ and the n-well, and $n^+$ and the p-well) in the area of the chip used by the DSR buffer memory of the present invention, as long as the n-well remains tied to a voltage supply which has not been reduced to the same extent as the p-channel source voltage. Other portions of the chip which use non-reduced voltage supplies would typically use the conventional (larger) spacings.

G. Yield Improvement with Redundancy.

The present invention includes the capability of working around any DSR in second memory stage 404 that contains a defect. In particular, controller 406 can sense that a particular DSR row includes a defective register stage, or is not capable of storing or reading the line of data that is stored by the row of registers. After this is detected, controller 406 works around the defective DSR row by preventing data from being transferred in or out of the defective DSR row. The defective DSR row is isolated from the operation of the present invention (in the partitioned case). This means that any local defect in the chip implementation of second memory stage 404 can be overcome by substituting the use of a redundant circuit for the defective circuit. Typically, one or more redundant lines of registers are provided in second memory stage 404 to provide this capability of working around a defective DSR row.

A write around approach can be used by the present invention. This means that certain DSR lines 906A to 906M can be inactivated either in hardware or in software. This allows defects in the DSR lines 906A to 906M to effectively be eliminated. This redundancy capability results in an much higher fabrication yield than would be the case if no redundancy was present.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the subjoined claims.

What is claimed is:

1. A computer system comprising:

at least one processor; and a memory system, coupled to said at least one processor, said memory system comprising:

a) a first bus means for transferring data;

b) a first memory stage means comprising a first first-in first-out (FIFO) buffer, coupled to said first bus means and to a second bus means, for storing data received from said second bus means in a first-in first-out manner, for reading out said stored data in a first-in first-out manner, and for providing said read out data to said first bus means;

c) a second memory stage means, coupled to said second bus means and to a third bus means, for storing data received from said third bus means, for clocking out said stored data in accordance with a line control data, and for supplying said clocked out data to said second bus means, wherein said second memory stage comprises a plurality of rows of shift registers, data being stored in and retrieved from said second memory stage means on a row basis such that each memory store operation operates to store data in a row of said shift registers, and each memory read operation operates to retrieve data from a row of said shift registers, each of said shift registers having a shift clock input multiplexor to select between a refresh shift clock signal and a read or write shift clock signal, wherein said refresh shift clock signal is a lower frequency than said read or write shift clock frequency;

d) a third memory stage means comprising a second FIFO buffer, coupled to said third bus means and to a fourth bus means, for storing data received from said fourth bus means in a first-in first-out manner, for reading out said stored data in a first-in first-out manner, and for supplying said read out data to said third bus means; and e) a controller means, coupled to said first memory stage means and to said second memory stage means and to said third memory stage means, for controlling data storage and data read operations of said first memory stage means, said second memory stage means in accordance with said line control data, and said third memory stage means.

2. A computer system, comprising:

at least one processor; and a memory system, coupled to said at least one processor, having a buffer memory layout floor plan comprising:

a) a first memory stage area having a first MOS cell means for storing and retrieving data in a first-in first out manner;

b) a second memory stage area, coupled to said first memory stage area, having a plurality of register rows for storing data on a row basis such that each memory store operation operates to store data in one of said register rows, and each memory read operation operates to retrieve data from one of said register rows, each register row comprising a shift register;

c) a third memory stage area, responsive to said second memory stage area, having a second MOS cell means for storing and retrieving data in a first-in first out manner; and d) a controller area, electrically coupled to said first memory stage area, to said second memory stage area, and to said third memory stage area, having control logic means for providing control and address signals to said first memory stage area, said second memory stage area, and said third memory stage area.

3. A computer system, comprising:

at least one processor;

a computer storage device, coupled to said at least one processor, said computer storage device having a memory buffer, said memory buffer comprising:

a first FIFO (first-in first-out) buffer;

means for storing data from a data source in said first FIFO buffer at a first speed;

means for retrieving data from said first FIFO buffer at a second speed;

a memory device comprising a plurality of register rows each comprising a shift register;

means for storing data retrieved from said first FIFO buffer in said memory device at said second speed on a row basis such that each memory store operation operates to store data in one of said register rows of said memory device;

means for retrieving data from said memory device at a third speed on a row basis such that each memory read operation operates to retrieve data from one of said register rows of said memory device;

a second FIFO buffer;

means for storing data retrieved from said memory device in said second FIFO buffer at said third speed;

means for retrieving data from said second FIFO buffer at a fourth speed; and means for storing data retrieved from said second FIFO buffer in a computer storage device at said fourth speed.

4. The computer system of claim 3, wherein said first speed is faster than said second, third, and fourth speeds.

5. The computer system of claim 3, wherein said first and second FIFO buffers store and retrieve data on a bit basis.

* * * * *